(12) United States Patent
Kubat et al.

(10) Patent No.: US 8,125,300 B2
(45) Date of Patent: Feb. 28, 2012

(54) SURFACE ACOUSTIC WAVE FILTER COMPRISING A BAND-PASS FILTER AND A BAND-STOP FILTER

(75) Inventors: Franz Kubat, Munich (DE); Thomas Bauer, Munich (DE)

(73) Assignee: EPCOS AG, Munich (DE)

( * ) Notice: Subject to any disclaimer, the term of this patent is extended or adjusted under 35 U.S.C. 154(b) by 199 days.

(21) Appl. No.: 12/538,511

(22) Filed: Aug. 10, 2009

(65) Prior Publication Data

US 2010/0026417 A1   Feb. 4, 2010

Related U.S. Application Data

(63) Continuation of application No. PCT/DE2008/000292, filed on Feb. 15, 2008.

(30) Foreign Application Priority Data

Feb. 19, 2007   (DE) .......................... 10 2007 008 110

(51) Int. Cl.
*H03H 9/64*   (2006.01)
*H03H 9/54*   (2006.01)
(52) U.S. Cl. ........................ 333/193; 333/195; 333/189
(58) Field of Classification Search .................. 333/189, 333/193–196; 310/313 B, 313 D
See application file for complete search history.

(56) References Cited

U.S. PATENT DOCUMENTS

| | | | |
|---|---|---|---|
| 4,126,837 A | 11/1978 | Koyamada et al. | |
| 4,577,168 A | 3/1986 | Hartmann | |
| 4,803,449 A | 2/1989 | Hikita et al. | |
| 4,910,481 A | 3/1990 | Sasaki et al. | |
| 5,521,453 A | 5/1996 | Yatsuda | |
| 5,854,579 A | 12/1998 | Penunuri | |
| 6,597,261 B2 | 7/2003 | Tsutsumi et al. | |
| 6,606,016 B2 * | 8/2003 | Takamine | 333/133 |
| 6,710,677 B2 | 3/2004 | Beaudin et al. | |
| 6,862,441 B2 | 3/2005 | Ella | |
| 6,879,224 B2 | 4/2005 | Frank | |
| 7,623,009 B2 * | 11/2009 | Kando et al. | 333/193 |
| 2004/0130411 A1 | 7/2004 | Beaudin et al. | |

(Continued)

FOREIGN PATENT DOCUMENTS

DE   101 22 007 B4   6/2002

(Continued)

OTHER PUBLICATIONS

English language machine translation of JP 2004-48283, published Feb. 12, 2004.*

(Continued)

*Primary Examiner* — Barbara Summons
(74) *Attorney, Agent, or Firm* — Slater & Matsil, L.L.P.

(57) ABSTRACT

An electric filter has a band-pass filter that includes a track with acoustically coupled electroacoustic transducers. The filter includes a band-stop filter with at least one electroacoustic series element and at least one electroacoustic parallel element. The series element of the band-stop filter is connected in series to at least one of the transducers of the band-pass filter. The parallel element of the band-stop filter is arranged in a shunt arm that is electrically connected to at least one of the transducers of the band-pass filter. In at least one of the electroacoustic elements of the band-stop filter, the resonance frequency and the anti-resonance frequency lie outside the passband of the band-pass filter.

17 Claims, 14 Drawing Sheets

U.S. PATENT DOCUMENTS

| | | | |
|---|---|---|---|
| 2006/0097824 A1* | 5/2006 | Detlefsen et al. | 333/193 |
| 2010/0127799 A1* | 5/2010 | Bauer et al. | 333/195 |

FOREIGN PATENT DOCUMENTS

| | | |
|---|---|---|
| DE | 10 2005 032 058 A1 | 1/2007 |
| EP | 0 664 610 B1 | 11/1998 |
| EP | 0 682 410 B1 | 12/2001 |
| EP | 0 718 970 B1 | 8/2004 |
| JP | 8-65097 * | 3/1996 |
| JP | 10-065489 A | 3/1998 |
| JP | 10-065490 A | 3/1998 |
| JP | 2001-230657 * | 8/2001 |
| JP | 2004-48283 * | 2/2004 |
| JP | 2006-157174 * | 6/2006 |
| WO | WO 03/069777 A1 | 8/2003 |
| WO | WO 2005/027535 A2 | 3/2005 |
| WO | WO 2007/007476 * | 1/2007 |

OTHER PUBLICATIONS

English language machine translation of JP 2001-230657, published Aug. 24, 2001.*

English language machine translation of JP 8-65097, published Mar. 8, 1996.*

* cited by examiner

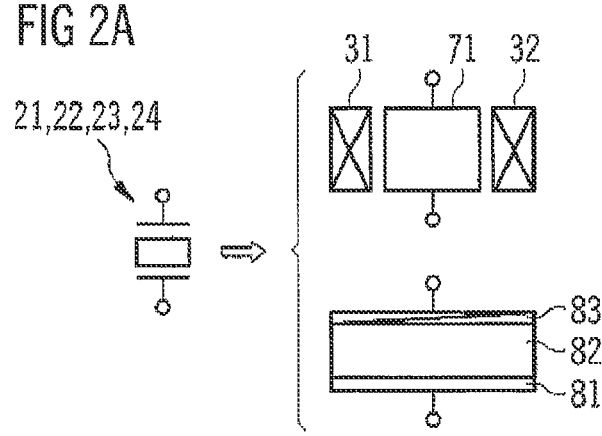
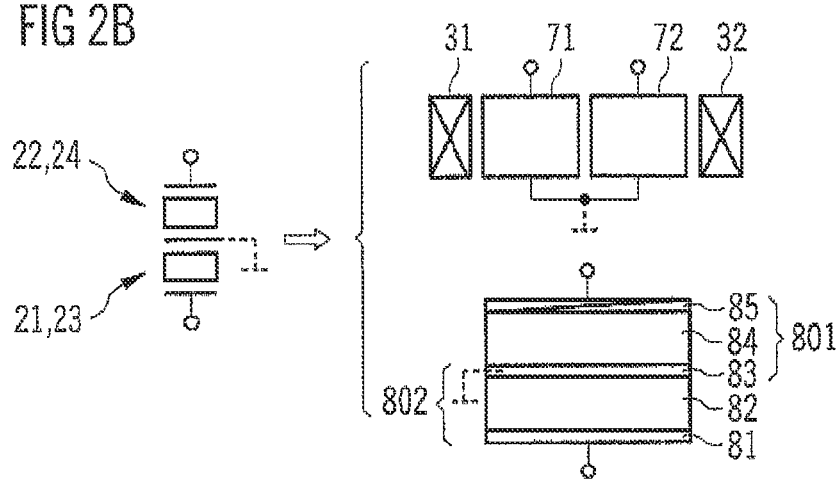
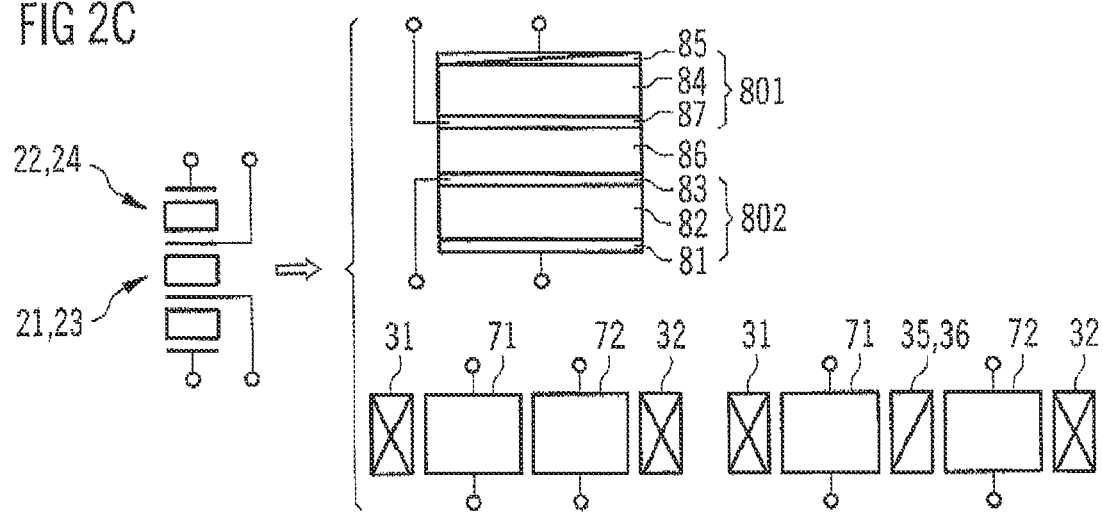

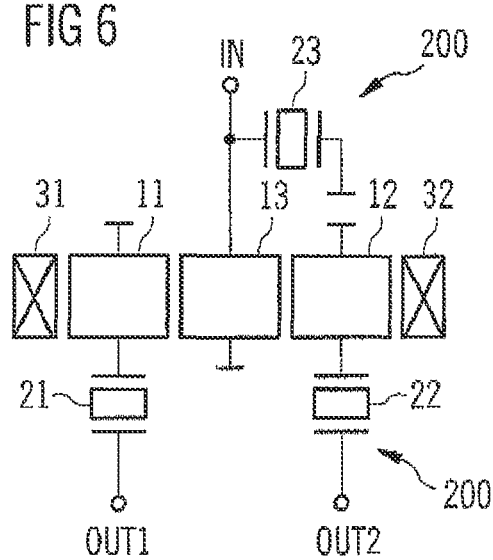
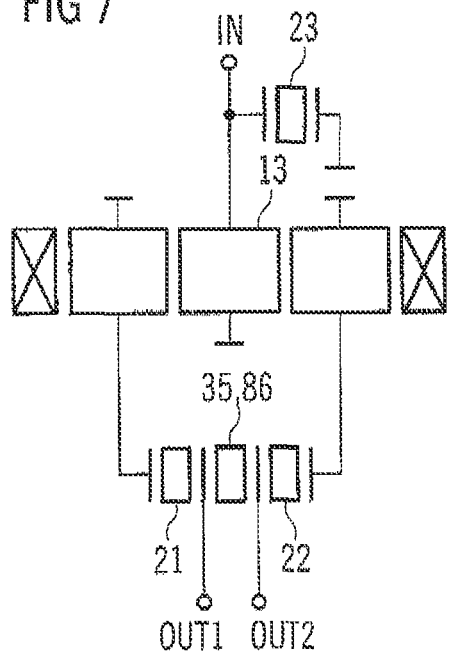
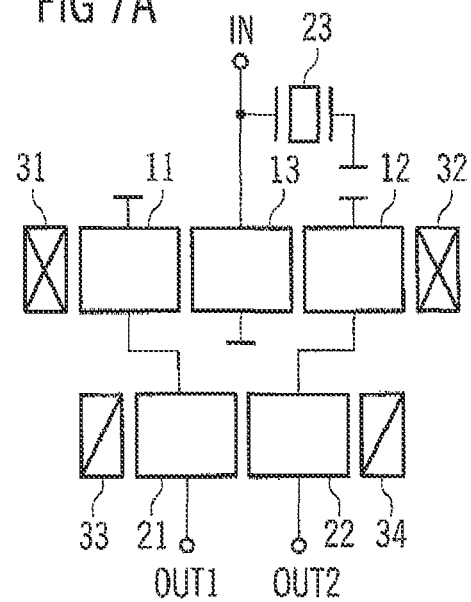

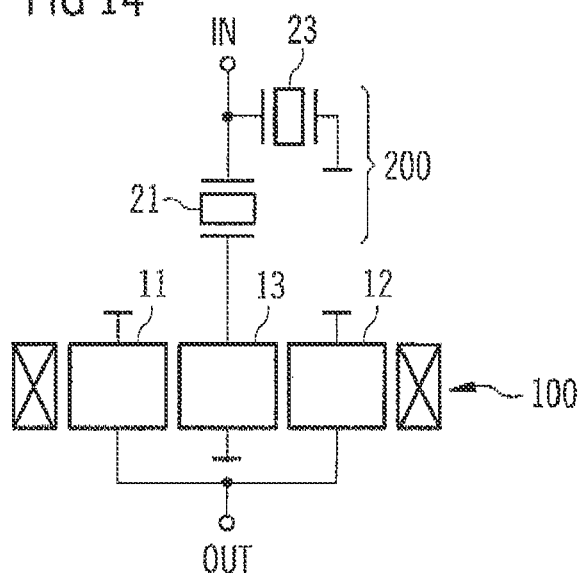
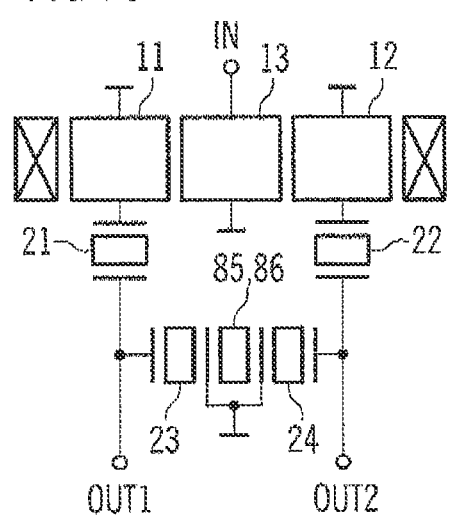
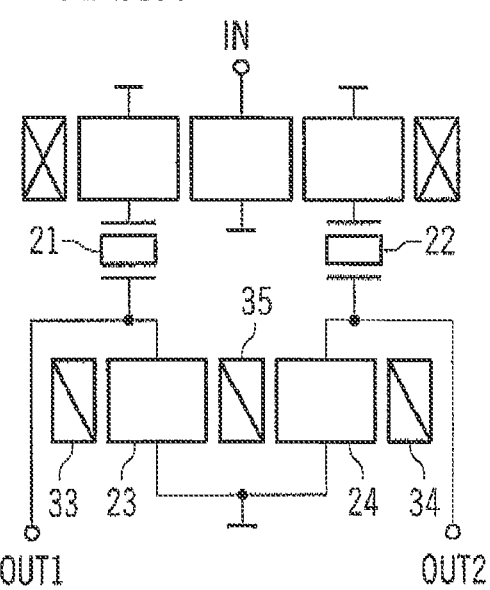

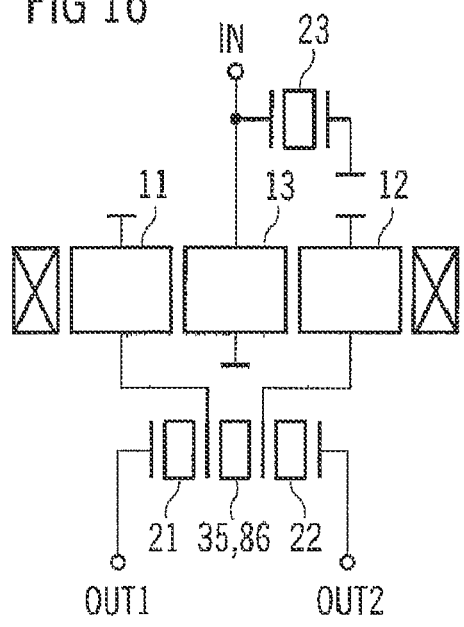
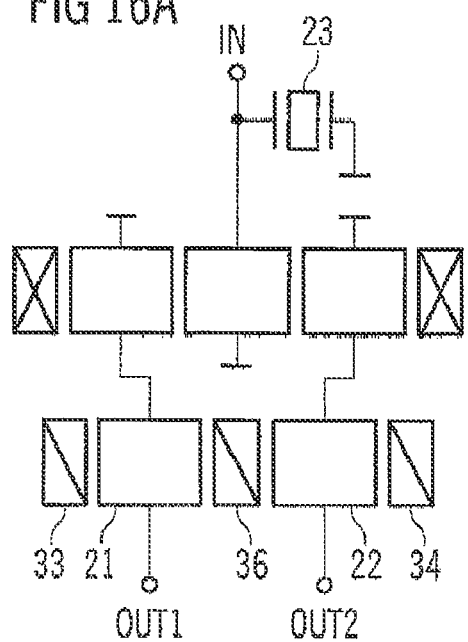
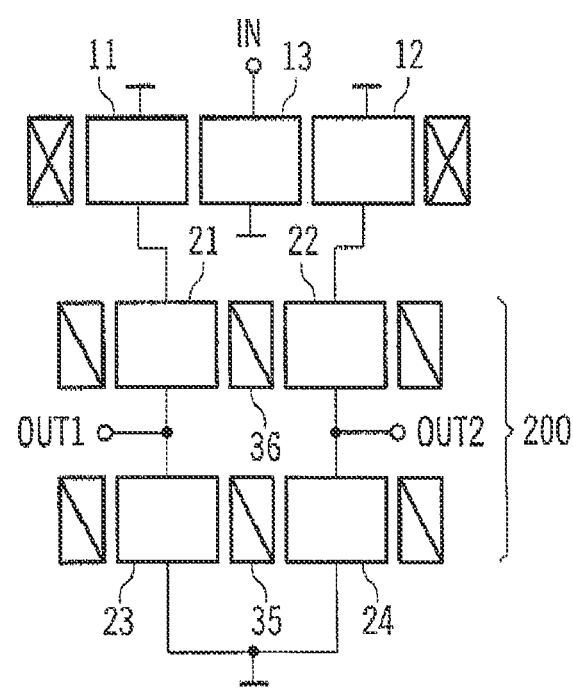

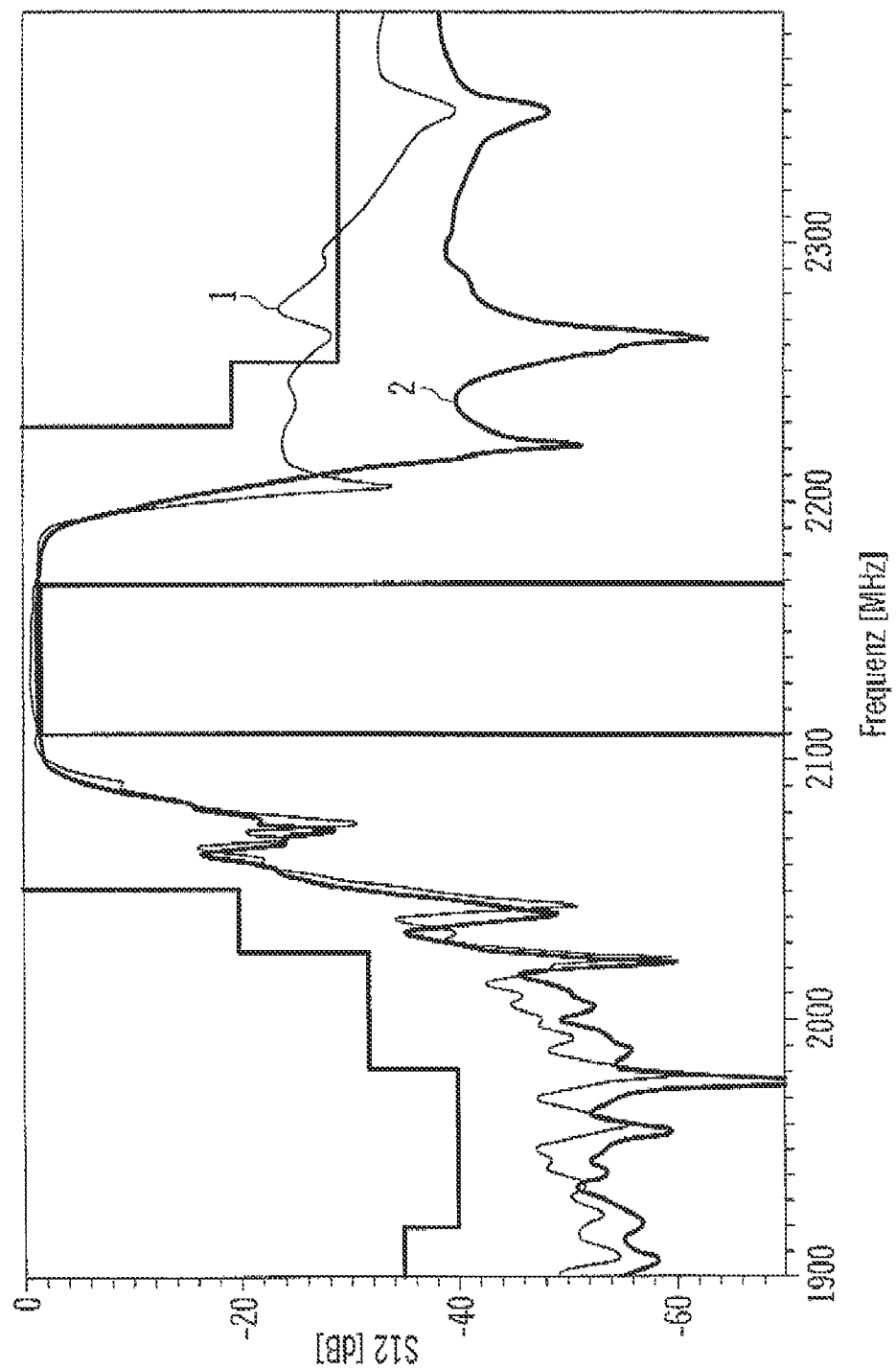

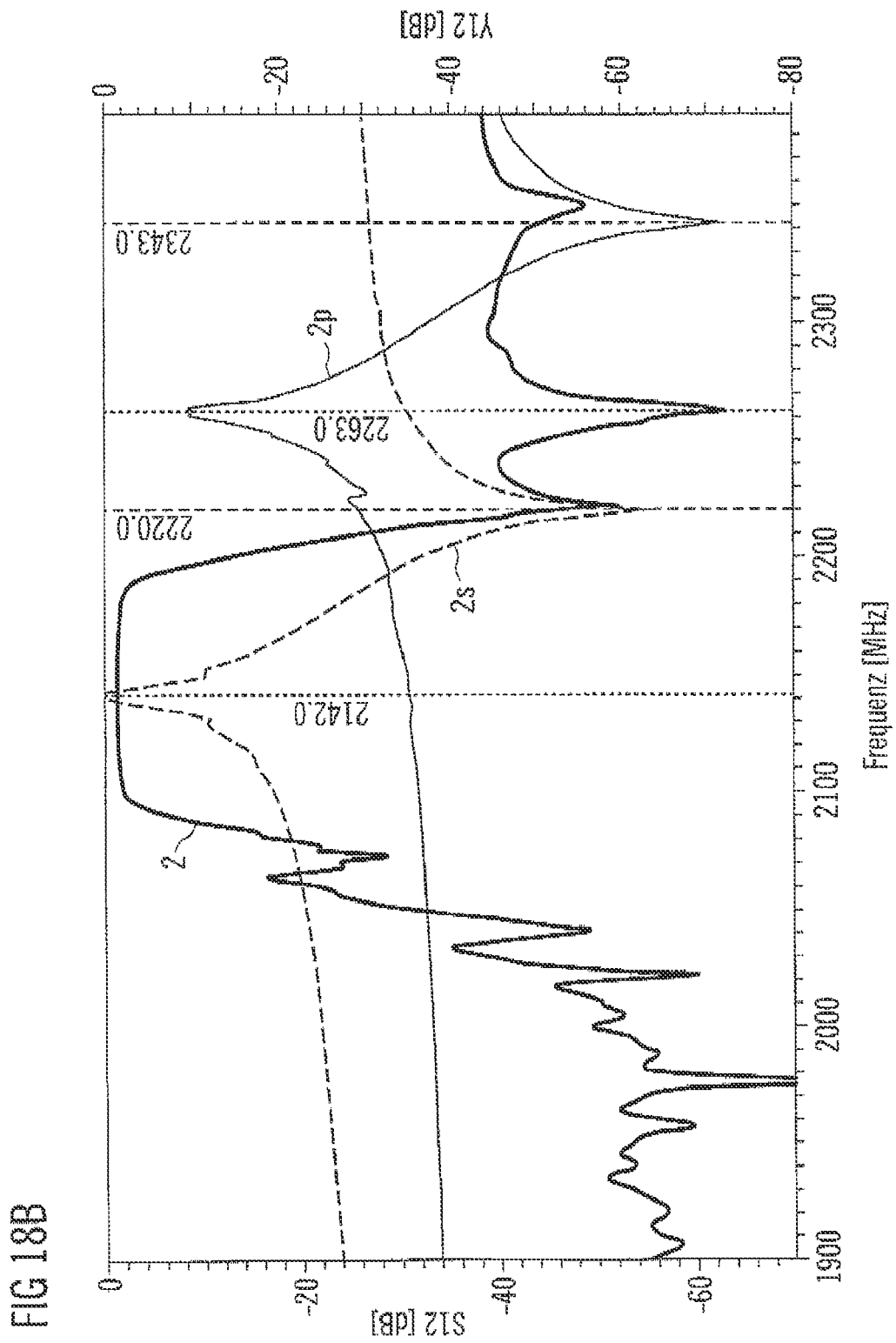

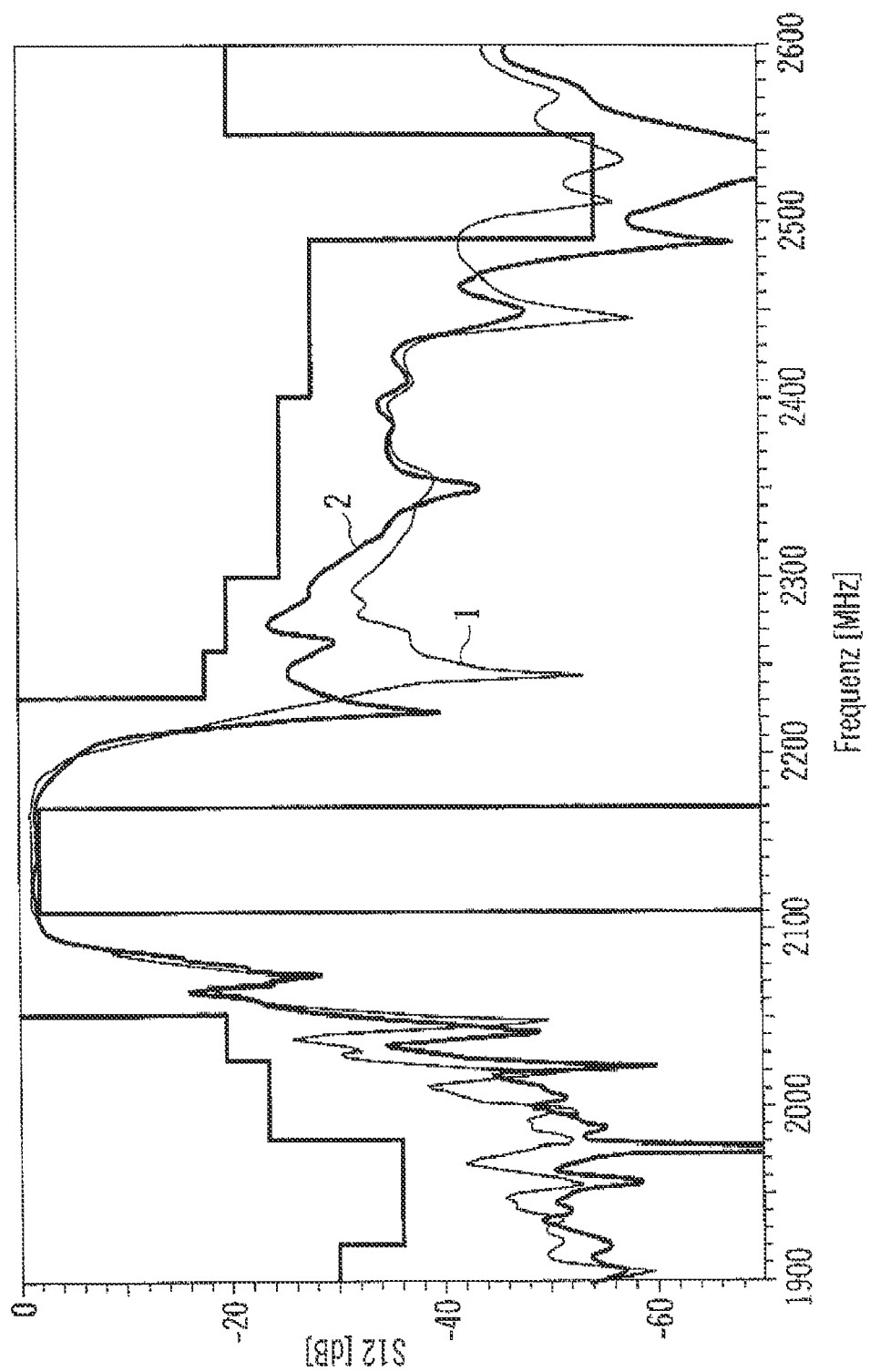

SURFACE ACOUSTIC WAVE FILTER COMPRISING A BAND-PASS FILTER AND A BAND-STOP FILTER

This application is a continuation of co-pending International Application No. PCT/DE2008/000292, filed Feb. 15, 2008, which designated the United States and was not published in English, and which claims priority to German Application No. 10 2007 008 110.5 filed Feb. 19, 2007, both of which applications are incorporated herein by reference.

BACKGROUND

A surface acoustic wave filter is known from U.S. Pat. No. 5,521,453.

SUMMARY

In one aspect, a filter of the initially cited type that has an improved adjacent channel selectivity and/or an improved remote channel selectivity is disclosed.

In one embodiment, an electric filter has a band-pass filter that comprises a track with acoustically coupled electroacoustic transducers. The filter comprises a band-stop filter with at least one electroacoustic series element and at least one electroacoustic parallel element. The series element of the band-stop filter is connected in series to at least one of the transducers of the band-pass filter. The series element of the band-stop filter is therefore arranged in a series branch of the filter circuit. The band-stop filter comprises at least one shunt arm in which the at least one electroacoustic parallel element is arranged. In at least one of the electroacoustic elements of the band-stop filter, the resonance frequency and the antiresonance frequency lie outside the passband of the band-pass filter.

The term band-stop filter refers to a filter that causes a high attenuation of signals in a stopband. On either side of the stopband, i.e., in the adjacent frequency ranges toward higher and lower frequencies, the band-stop filter has a passband with low attenuation that is broad in comparison with the stopband.

Ideally, all frequencies below and above the stopband are transmitted with low attenuation.

The passband preferably extends over at least one or more bands that are used in mobile communications systems or in other wireless transmission and communications systems.

A band-stop filter can, for example, have a passband with a relative bandwidth of approximately 3-8% and in places even up to 50% or more.

The disclosed filter is preferably realized in the form of a high-frequency filter, particularly for the GHz range. It is characterized by a low insertion loss in the passband. Depending on the design of the band-stop filter, it is possible to improve the adjacent channel selectivity or the remote channel selectivity of the band-pass filter.

In one variation, the disclosed filter is realized in the form of a transmission filter. In this case, the band-stop filter should suppress received signals in the transmission path. The suppression is improved in a stopband that lies above the passband of the transmission filter. In another variation, the disclosed filter is realized in the form of a reception filter. In this case, the band-stop filter should suppress transmitted signals in the reception path. The suppression is improved in a stopband that lies below the passband of the transmission filter.

The band-stop filter is also particularly advantageous for suppressing intermodulation products and band noise.

The band-stop filter makes it possible to provide at least 50 dB of suppression of interfering signals. The increase of insertion loss caused by the band-stop filter lies below 0.2 dB.

The different known notch filters and band-stop filters with a small stop bandwidth are essentially based on an interconnection of impedance elements. Such interconnections of impedance elements can consist, for example, of a ladder type arrangement with SAW resonators that are in this case arranged in series or in parallel branches. A passband with reasonable bandwidth can be realized with a matching network. In one advantageous variation, the series element comprises at least one SAW transducer that is referred to below as a series transducer. In one advantageous variation, the parallel element comprises at least one SAW transducer that is referred to as a parallel transducer below. SAW stands for Surface Acoustic Wave, i.e., acoustic surface wave.

A SAW transducer comprises an acoustic track in which first and second fingers are arranged. The fingers are realized in the form of metal strips that extend perpendicular to the direction of the track. The first fingers are connected to a first busbar and the second fingers are connected to a second busbar. The first and second fingers are preferably arranged alternately.

The fingers are essentially arranged at a periodic pitch at least in a central region of the respective transducer. The finger spacing is measured between the centers of the successively arranged fingers. The finger spacing can deviate from the periodic pitch, particularly in the edge regions of a transducer.

The ratio of the finger periods in the interdigital transducers that define the frequency of the respective impedance elements is decisive for the stopping effect of the band-stop filter based on a SAW interdigital transducer. In this case, the average finger period in the interdigital transducer of the at least one series element is greater than the average finger period in the interdigital transducer of the electroacoustic parallel element or parallel elements. Consequently, the center frequency or resonance frequency in the interdigital transducers of the parallel elements that corresponds to the finger period is higher than the center or resonance frequency of the series elements. A suitable ratio between the finger period $P_s$ of the interdigital transducer of the series element and the finger period $P_p$ of the interdigital transducer of the parallel element can lie between 1.03 and 1.10, and then also corresponds to the ratio of the center or resonance frequencies.

A SAW transducer preferably forms part of a SAW resonator. In one variation, a SAW resonator is composed of a transducer and two reflectors between which the transducer is arranged. In another variation, the SAW resonator comprises a transducer arrangement with at least two adjacently arranged transducers that are acoustically coupled to one another. The transducer arrangement is arranged between two reflectors. The SAW resonators can comprise a DMS track. DMS stands for Double Mode Surface Acoustic Wave.

In one advantageous variation, the series element comprises at least one BAW resonator. In one variation, the parallel element comprises at least one BAW resonator. BAW stands for Bulk Acoustic Wave, i.e., acoustic bulk wave.

The general rule that the resonance frequency of the parallel elements is preferably higher than the resonance frequency of the series elements also applies to band-stop filters with electroacoustic series and/or parallel elements based on BAW resonators.

Although the described filter features SAW transducers, the description applies analogously to a BAW configuration. In this respect, a SAW transducer is replaced with a BAW resonator. The description of an acoustic track that comprises acoustically coupled transducers or an inline arrangement of transducers applies analogously to a resonator stack with BAW resonators that are arranged on top of one another and are acoustically coupled, if applicable.

In principle, the above-described surface acoustic wave band-pass filter can be replaced with a bulk acoustic wave filter (BAW filter). The BAW filter preferably comprises BAW resonators that are acoustically coupled to one another. In another variation, the BAW filter comprises BAW resonators that are interconnected in a ladder type arrangement. The ladder type arrangement comprises series resonators that are arranged in a signal path and parallel resonators that are arranged in shunt arms.

Advantageous embodiments of the filter are described below.

In one variation, the series element and the parallel element are conductively connected to one another. In this case the band-stop filter can be connected upstream or downstream of the band-pass filter.

In another variation, the series element is arranged in a signal path on the input side, whereas the shunt arm with the parallel element is connected to a signal path on the output side that is preferably electrically isolated from the signal path on the input side. The input side and the output side can be interchanged. In this case, the band-pass filter is arranged between the series element and the parallel element of the band-stop filter.

In one embodiment, the resonance frequency and the anti-resonance frequency of the series element and of the parallel element lie outside the passband of the band-pass filter.

In one variation, the resonance frequency and the anti-resonance frequency of both elements of the band-stop filter lie above the passband of the band-pass filter. In this case, the average finger spacing of the series transducer and of the parallel transducer of the band-stop filter is smaller than the respective average finger spacing of the band-pass filter.

The average finger spacing of the band-pass filter is defined as the ratio between the length of the acoustic track and the number of fingers in this track. The length of the acoustic track is measured between the outwardly facing edges of the end-situated fingers.

In another variation, the resonance frequency of the series element of the band-stop filter lies in the passband of the band-pass filter, whereas its anti-resonance frequency lies above the passband of the band-pass filter. The resonance frequency and the anti-resonance frequency of the parallel element of the band-stop filter also lie above the passband of the band-pass filter. The average finger spacing of the series transducer is essentially identical to that of the band-pass filter. The average finger spacing of the parallel transducer is smaller than that of the band-pass filter.

In another variation, the resonance frequency and the anti-resonance frequency of both elements of the band-stop filter lie below the passband of the band-pass filter. In this case, the average finger spacing of the series transducer and the parallel transducer of the band-stop filter is greater than that of the band-pass filter.

In another variation, the resonance frequency and the anti-resonance frequency of the series element of the band-stop filter lie below the passband of the band-pass filter, whereas the anti-resonance frequency of the parallel element of the band-stop filter lies in the passband of the band-pass filter. In this case the average finger spacing of the parallel transducer is essentially identical to that of the band-pass filter. The average finger spacing of the series transducer is greater than that of the band-pass filter.

The filter features a first electric port that is realized symmetrically (balanced) in one variation. In this case, the filter comprises a first signal path and a second signal path that are designed for balanced signal routing.

The filter features a second electric port that is realized symmetrically (balanced) in one variation. This means that the filter is wired symmetrically on the input side and on the output side.

In another variation, the second port is realized asymmetric (single-ended). In this case, the filter represents a balun. In another variation, both ports of the filter are realized asymmetrically.

The transducers of the band-pass filter comprise at least one input transducer that is connected to an input path of the filter and at least one output transducer that is connected to an output path of the filter.

The band-pass filter features a transducer arrangement that is arranged in the acoustic track and preferably comprises at least three adjacently arranged transducers that are acoustically coupled to one another. Each transducer is preferably grounded. The two sides of the acoustic track of the band-pass filter are bounded by two acoustic reflectors. The band-pass filter is preferably realized in the form of a DMS filter.

In one advantageous variation, the transducer arrangement of the band-pass filter comprises more than three transducers, among others, input transducers and output transducers. At least two of the input or output transducers can be connected in parallel and to a signal path.

In one variation, a series circuit of a first series element of the band-stop filter and a first transducer of the band-pass filter is arranged in the first signal path. A series circuit of a second series element of the band-stop filter and a second transducer of the band-pass filter is arranged in the second signal path.

In one variation, the band-stop filter comprises a first parallel element and a second parallel element. The series circuit of the first and the second parallel element is arranged in the shunt arm. The parallel elements are connected to one another by a conductive connection that can be floating or grounded.

In one embodiment, the band-stop filter features an inline arrangement of transducers that comprises at least two elements of the band-stop filter. In this case, each element of the band-stop filter is realized in the form of a transducer.

In one variation, the inline arrangement comprises the first and the second series element of the band-stop filter. In another variation, the inline arrangement comprises the series element and the parallel element of the band-stop filter.

In another variation, the inline arrangement comprises the first and the second parallel element of the band-stop filter. In one variation, the first and the second parallel element are conductively connected to one another and grounded, if applicable.

The elements (transducers) of the band-stop filter that are disposed in the form of an inline arrangement are preferably arranged adjacent to one another and acoustically coupled to one another.

The inline arrangement can be realized in the form of a multi-port resonator that comprises the first and the second series element of the band-stop filter. The inline arrangement can be realized in the form of a multi-port resonator that comprises the first and the second parallel element of the band-stop filter. The term multi-port resonator generally refers to an acoustic track with a number N of transducers that are arranged adjacent to one another in the propagation direction of the wave and form a 2N-pole. N is a natural number greater than or equal to two.

In comparison with N separate resonators, a multi-port resonator with N transducers in one track represents a particularly space-saving solution. A multi-port resonator makes it possible to reduce losses.

The individual transducers of the multi-port resonator are acoustically coupled and can be arranged in series branches of the filter circuit, as well as in shunt arms thereof. The acoustic coupling of two resonators or transducers makes it possible to generate an additional pole or zero point in the transfer function of the filter as a whole. This can be used for a targeted suppression at a certain frequency.

The inline arrangement can feature an intermediate reflector that is arranged between the transducers. In one variation, the intermediate reflector is in part acoustically permeable.

In another variation, the acoustic reflector is acoustically impermeable. In this case the inline arrangement comprises two resonators that are acoustically decoupled from one another and have a common reflector. This design is particularly space-saving.

The band-stop filter can feature several inline arrangements or multi-port resonators. A first inline arrangement preferably comprises two series elements and a second inline arrangement comprises two parallel elements of the band-stop filter.

The filter features a third signal path in which a third transducer of the band-pass filter is arranged. The third signal path is preferably unbalanced (single-ended) and electrically isolated from the first and the second signal path. The third signal path forms an input path and the first and the second signal path form an output path or vice versa.

In one variation, the shunt arm connects the first signal path and the second signal path. The shunt arm can also ground one of the signal paths such as, for example, the third signal path.

In one variation, a series circuit of the series element and the third transducer of the band-pass filter is arranged in the third signal path.

In one variation, the band-stop filter comprises at least one other shunt arm in which another electroacoustic parallel element or a series circuit of parallel elements is arranged.

In one embodiment, the first and the second transducer of the band-pass filter are connected in parallel and to a common signal path. In one variation, the shunt arm with the parallel element is connected to the common signal path. In one variation, the series element is arranged in the common signal path. The series element of the band-stop filter can alternatively be arranged in the third signal path.

In one variation, the common signal path is electrically isolated from the third signal path and forms (instead of the first and the second signal path) an output path.

In one advantageous variation, the series elements and the at least one parallel element in the shunt arm are arranged in a common acoustic track. The series elements and the at least one parallel element are acoustically coupled to one another.

BRIEF DESCRIPTION OF THE DRAWINGS

The disclosed filter is described below with reference to schematic drawings that are not true-to-scale. In these drawings:

FIGS. 2A, 2B, 2C illustrate equivalent circuit diagrams;
FIG. 6 shows a filter in which the band-stop filter comprises two series elements connected to the output side and one parallel element connected to the input side;
FIG. 7 shows a variation of the filter according to FIG. 6, in which the series elements are acoustically coupled to one another;
FIG. 7A shows another variation of the filter according to FIG. 6, in which the series elements are acoustically coupled to one another;
FIG. 14 shows the filter according to FIG. 9 that on both sides is wired unbalanced to ground;
FIG. 15 shows a variation of the filter according to FIG. 3, in which the parallel elements are realized in a resonator stack;
FIG. 15A shows a variation of the filter according to FIG. 3, in which the parallel elements are realized in an inline arrangement with an intermediate reflector;
FIG. 16 shows a variation of the filter according to FIG. 6, in which the parallel elements are realized in a resonator stack;
FIG. 16A shows a variation of the filter according to FIG. 6, in which the parallel elements are realized in an inline arrangement with an intermediate reflector;

FIG. 17 shows a variation of the filter according to FIG. 3, in which the series elements and the parallel elements are respectively realized in an inline arrangement with an intermediate reflector;

FIGS. 18A, 19A respectively show transfer functions for a filter with and without band-stop filter; and FIGS. 18B, 19B respectively show transfer functions for a filter with band-stop filter and the frequency response of the sum of the conductance Y of the series element and of the parallel element of the band-stop filter.

Figure 1A:
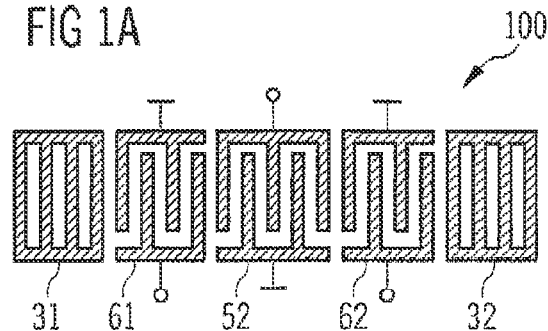
FIGS. 1A, 1B, 1C, 1D, 1E and 1F each show a band-pass filter that is used in the disclosed filter.

The following list of reference symbols may be used in conjunction with the drawings:

1 Transfer function of a DMS filter without band-stop filter
2 Transfer function of a DMS filter with band-stop filter
2s Admittance curve for series element
2p Attendance curve for parallel element
11 First transducer
12 Second transducer
13 Third transducer
21, 22 Series element of band-stop filter
23, 24, 25 Parallel element of band-stop filter
31, 32, 33, 34 Acoustic reflector
35, 36 Intermediate reflector
51, 52, 53 Input transducer
58, 59 Input transducer
55a, 55b Partial transducer of transducer 55
61, 62, 63 Output transducer
62a, 62b Partial transducer of transducer 62
66, 67, 68, 69 Output transducer
71, 72 Transducer
81, 83, 85, 87 Electrodes
82, 84 Piezoelectric layer
86 Coupling layer
100 Band-pass filter
200 Band-stop filter
801, 802 BAW resonator
IN Terminal of input port
OUT, OUT1, OUT2 Terminals of output port

DETAILED DESCRIPTION OF ILLUSTRATIVE EMBODIMENTS

FIG. 1A shows an exemplary band-pass filter 100 that is realized in the form of a DMS filter with transducers 52, 61, 62 that are longitudinally acoustically coupled. The band-pass filter 100 comprises an acoustic track that is bounded by acoustic reflectors 31, 32 on both sides. A transducer arrangement comprising two output transducers 61, 62 and one input transducer 52 arranged between these output transducers is arranged in the track.

The input transducer 52 is connected to an (unbalanced) input path. The first output transducer 61 is connected to a first output path and the second output transducer 62 is connected to a second output path.

The DMS filter can act as a balun, wherein the first and the second output path jointly form a balanced signal path.

However, the output transducers 61, 62 can also be conductively connected to one another and to a common (unbalanced) signal path. This corresponds to a DMS filter with two unbalanced ports.

In the case of several input transducers and several output transducers, at least one first input transducer could be connected to a first sub-path and at least one second input transducer could be connected to a second sub-path of a balanced input path. At least one first output transducer is then connected to a first sub-path and at least one second output transducer is connected to a second sub-path of a balanced output path. This corresponds to a DMS filter with two balanced ports.

Each transducer features two comb-like electrodes with electrode fingers that engage into one another. An acoustic wave is excited between two fingers that are connected to different electric potentials. The wave propagates in the longitudinal direction of the acoustic track. The input and output transducers are acoustically coupled in the longitudinal direction. The wave stimulated in the input transducer 52 excites an electric signal in the output transducers 61, 62.

Figure 1B:
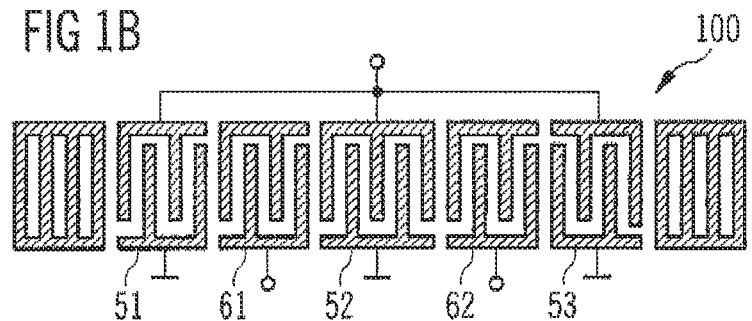

FIG. 1B shows another variation for realizing the band-pass filter, in which the transducer arrangement features three input transducers 51, 52, 53 that are connected in parallel.

Figure 1C:
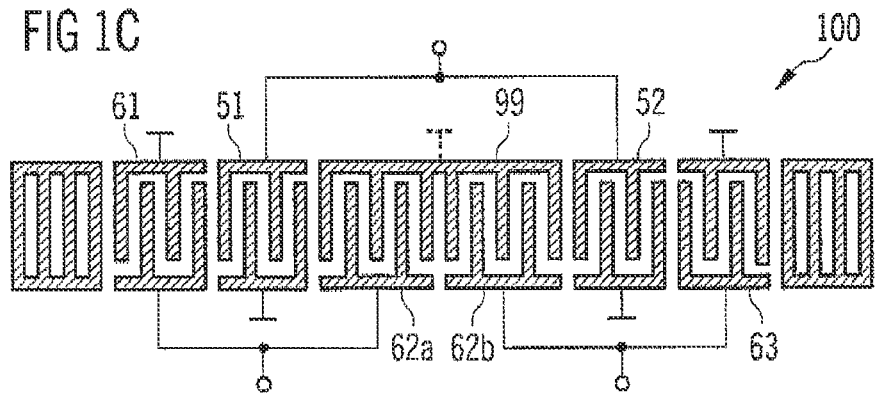
Figure 1D:
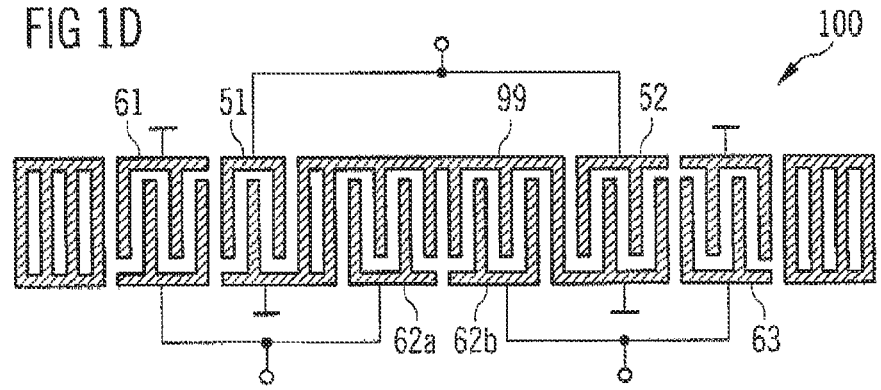

In FIG. 1A, the input transducer 52 is arranged between two output transducers 61, 62. Conversely, an output transducer can be arranged between two input transducers. The input and output transducers are preferably arranged in alternating sequence. In one variation, one of the input or output transducers such as, for example, the central output transducer 62 in FIGS. 1C and 1D, is divided into successively arranged partial transducers 62a, 62b by means of a V-split. The partial transducers 62a, 62b are preferably conductively connected to one another by a common busbar 99.

Instead of providing only one input transducer, it would also be possible, in principle, to use a parallel circuit of at least two input transducers. Instead of providing only one output transducer, it would also be possible, in principle, to use a parallel circuit of at least two output transducers.

In the variation shown in FIG. 1C, two input transducers 51, 52 are connected in parallel and to an input terminal of the input port. The partial transducer 62a is conductively connected to the first output transducer 61 and to a first output terminal of the output port. The partial transducer 62b is conductively connected to the second output transducer 62 and to a second output terminal of the output port.

The common busbar 99 that connects the two partial transducers 62a, 62b of the central output transducer 62 can be realized in a floating fashion. However, it can also be grounded. According to the variation shown in FIG. 1D, the ground connection of the busbar 99 can be realized in the form of a conductive connection between the busbar 99 and chassis ground buses of the input transducers 51 and/or 52. This conductive connection is produced with the aid of extended fingers of ground electrodes of the transducers 51, 62a and 62b, 52, and leads through the acoustic track.

Figure 1E:
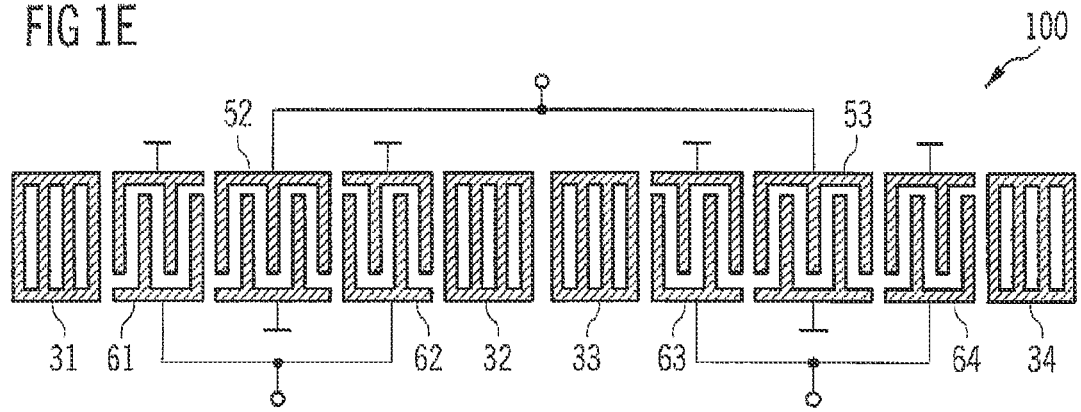

The band-pass filter 100 can feature two DMS filters that are conductively connected to one another as shown in FIG. 1E. The input transducers 52, 53 of the two DMS tracks are conductively connected to one another and to the input terminal of the band-pass filter. The output transducers 61, 62 of the first DMS filter are conductively connected to one another and to the first output terminal of the band-pass filter. The output transducers 63, 64 of the second DMS filter are conductively connected to one another and to the second output terminal of the band-pass filter.

Figure 1F:
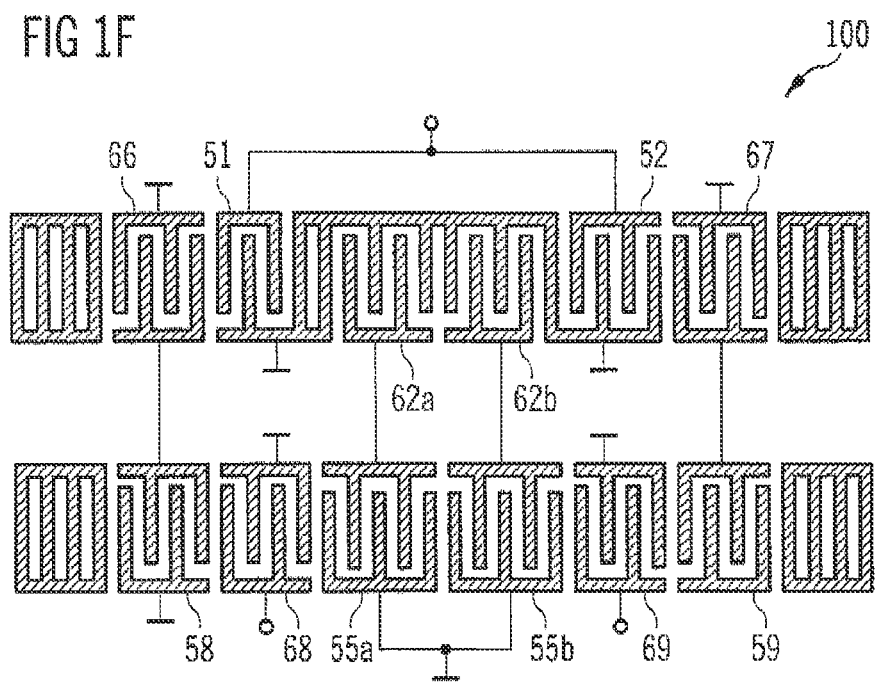

The two DMS filters shown in FIG. 1E form an inline arrangement. The reflectors 32, 33 can be replaced with a common reflector for both DMS filters. FIG. 1F shows another embodiment of the band-pass filter 100. In this case, the band-pass filter features two acoustic tracks that are coupled to one another and respectively realized in the form of a DMS track.

Each output transducer 62a, 62b, 66, 67 of the first DMS track is connected in series to one of the input transducers 55a, 55b, 58, 59 of the second DMS track (transducer 66 to transducer 58, transducer 62a to transducer 55a, transducer 62b to transducer 55b and transducer 67 to transducer 59). These transducers represent coupling transducers for acoustically coupling the two DMS tracks.

The input transducers 51, 52 of the first DMS track are conductively connected to one another and to the input terminal of the band-pass filter. The first output transducer 68 of the second DMS filter is connected to the first output terminal of the band-pass filter. The second output transducer 69 of the second DMS filter is connected to the second output terminal of the band-pass filter.

In the embodiments of the filter described below, the band-pass filter 100 according to FIG. 1A can be replaced with the variations according to one of FIGS. 1B-1F or a similarly designed band-pass filter. The number of input and output transducers is not limited to the variations shown.

FIGS. 2A, 2B and 2C illustrate equivalent circuit symbols (left) for acoustic resonators (right) that are used as series elements 21, 22 and/or parallel elements 23, 24 of the band-stop filter 200 in the following figures. FIGS. 2A, 2B show an acoustic one-port resonator and FIG. 2C shows an acoustic two-port resonator.

A surface acoustic wave resonator comprises an acoustic track with a transducer arrangement that features at least one SAW transducer 71, 72. The transducer arrangement is arranged between two reflectors 31, 32 that border the two sides of the acoustic track. The transducer arrangement and the reflectors jointly form an inline arrangement. The inline arrangement can comprise an intermediate reflector 35 or 36 that is in part acoustically permeable and is arranged between two transducers 71, 72 of the transducer arrangement (see FIGS. 2C, 15A, 16A, 17).

In another variation, a surface acoustic wave resonator comprises an inline arrangement that features an acoustically impermeable intermediate reflector 35 in addition to the transducers 71, 72. The transducer 71 and the reflectors 31, 35 jointly form a first resonator, the transducer 72 and the reflectors 35, 32 form an independent second resonator. Both acoustically decoupled resonators have a common reflector in this case.

The SAW transducers of an inline arrangement can be conductively connected to one another as shown in FIG. 2B. A connection of this type can be produced with a common busbar. However, the resonator with N transducers can also be connected like a 2N-pole as shown in FIG. 2C. N is a natural number greater than or equal to two.

A bulk acoustic wave resonator comprises a resonator stack with at least one BAW resonator. Each BAW resonator comprises two electrodes 81, 83, 85, 87 and a piezoelectric layer 82, 84 arranged between the electrodes. BAW resonators 801, 802 that are arranged on top of one another can feature a common electrode like the electrode 83 in FIG. 2B. In another variation, the coupling layer 86 that preferably is in part acoustically permeable is arranged between the BAW resonators 801, 802. The coupling layer 86 can, however, also be replaced with an impermeable acoustic mirror.

The BAW resonator 801, 802 corresponds to the SAW transducer 71, 72. The coupling layer 86 corresponds to the intermediate reflector 35 that is in part acoustically permeable and is also suitable as a coupling element. The longitudinal acoustic coupling between two adjacently arranged SAW transducers that are arranged in one and the same acoustic track corresponds to a vertical acoustic coupling between two BAW resonators that are realized in one and the same resonator stack. This is why a SAW resonator can be replaced with a BAW resonator in an embodiment and vice versa. A SAW resonator with a number N of coupled transducers is then replaced with a resonator stack with N coupled BAW resonators.

Figure 3:
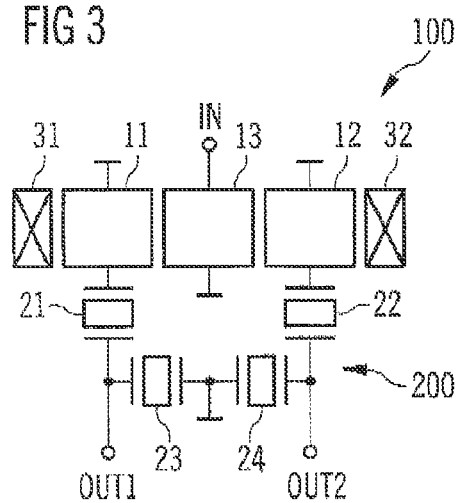
FIG. 3 shows a filter in which the band-stop filter comprises two series elements and a shunt arm with two series-connected parallel elements.

Different embodiments of the filter with a band-pass filter 100 and a band-stop filter 200 are illustrated in FIG. 3, et seq. The band-pass filter 100 comprises a first transducer 11, a second transducer 12 and a third transducer 13.

The band-stop filter 200 comprises a first series element 21, a second series element 22, a first parallel element 23, and a second parallel element 24.

The transducers 11, 12 act as output transducers and the transducer 13 acts as an input transducer. The transducer 13 is arranged in an input path. The transducers 11, 12 are respectively arranged in the first and second output path (FIGS. 3, 4, 5, 5A, 6, 7, 7A, 8, 8A, 8B, 8C, 9, 10, 13, 13A, 15, 15A, 16, 16A, 17) or connected in parallel and to a common (single-ended) output path (FIGS. 11, 12, 12A, 14). The signal path connected to the third transducer 13 of the DMS track is referred to as an input path in the figures. The input and output side can also be interchanged.

In the variations shown, the input path is realized in a single-ended fashion. If a corresponding number of input transducers is provided and wired accordingly, it can also be realized in a balanced fashion, analogous to the output path.

FIG. 3 shows a first filter. A series circuit of the first transducer 11 and the first series element 21 is arranged in the first output path. A series circuit of the second transducer 12 and the second series element 22 is arranged in the second output path. The first and the second output path jointly form a balanced signal path. The series elements 21, 22 are realized in the form of acoustic resonators and are acoustically decoupled from one another. This also applies to FIGS. 4, 5, 5A, 6, 14, 15A.

A shunt arm is arranged between the two output paths. A series circuit of the first and second parallel elements 23, 24 of the band-stop filter is arranged in the shunt arm. The parallel elements 23, 24 are constructed as acoustic resonators that are acoustically decoupled from each other and are conductively connected to each other. This also applies to FIGS. 5A, 8, 8A.

The two parallel elements 23, 24 connected one behind the other can be connected to ground. However, the electrical connection between the parallel elements 23, 24 can also remain floating. This also applies to FIGS. 8, 8A, 8B, 10, 15, 15A, 16A.

Figure 4:
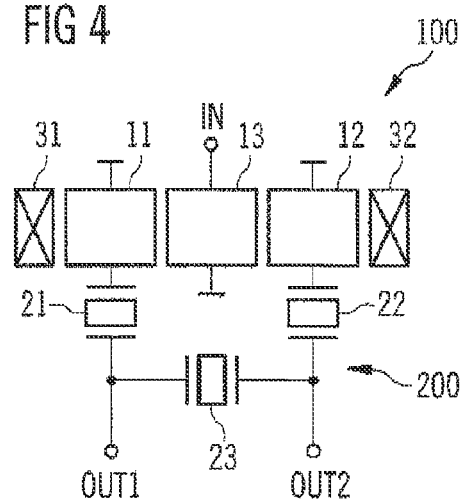
FIG. 4 shows a filter in which the band-stop filter comprises two series elements and a shunt arm with one parallel element.

In the variation according to FIG. 4, only one parallel element 23 is provided rather than a series circuit of the first and the second parallel elements 23, 24. In the variation according to FIG. 5, a second shunt arm with the second parallel element 24 is provided in addition to the first shunt arm with the first parallel element 23.

Figure 5:
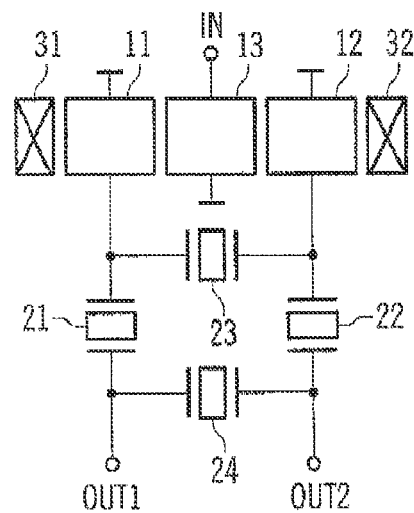
FIG. 5 shows a filter in which the band-stop filter comprises two series elements and two shunt arms that respectively feature one parallel element.

In the variations according to FIGS. 3, 4 and 5, the series and parallel elements of the band-stop filter 200 form a ladder type arrangement of acoustic resonators on the output side for a balanced signal path. Alternatively, a ladder type arrangement that is arranged in the single-ended input path can feature a series element 21 that is arranged in the series branch and a grounded parallel element 23 arranged in the shunt arm, as shown in FIGS. 9 and 14.

Figure 9:
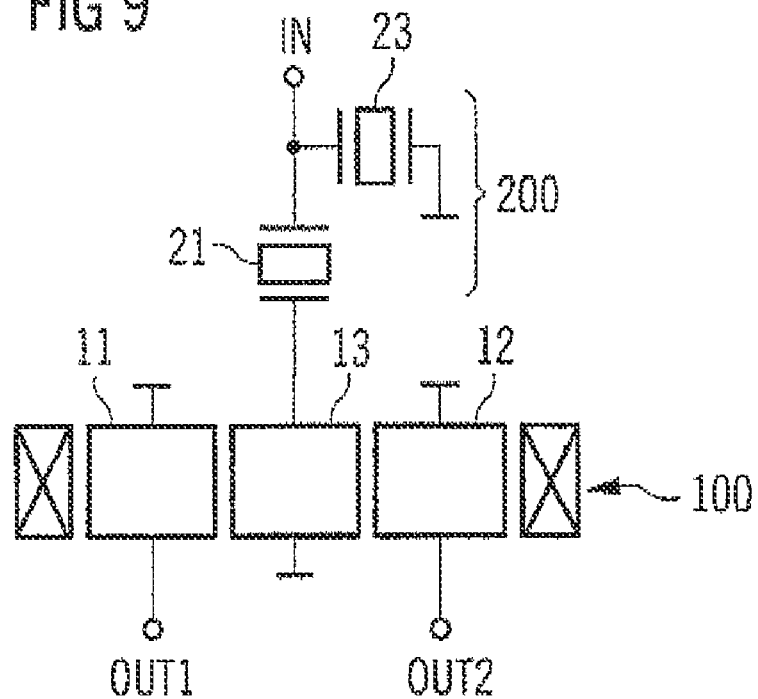
FIG. 9 shows a filter in which the series element and the parallel element of the band-stop filter form an L-element.
Figure 13:
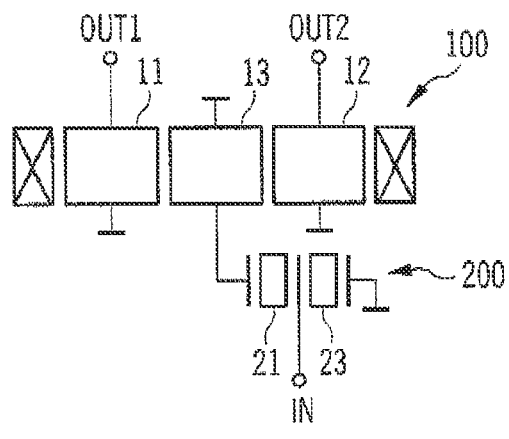
FIG. 13 shows a filter in the form of a balun, in which the series element and the parallel element of the band-stop filter are acoustically coupled to one another.
Figure 13A:
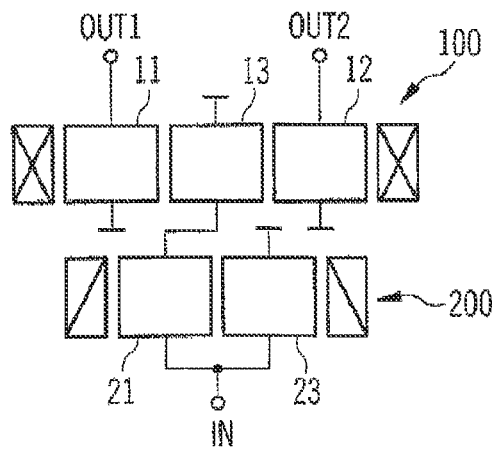
FIG. 13A shows the filter according to FIG. 13, in which the series element and the parallel element of the band-stop filter are arranged in an acoustic track.

In FIGS. 9 and 14, band-stop elements 21, 23 that are acoustically decoupled from one another form a simple ladder type element (L-element). The variation with coupled band-stop elements 21, 23 is shown in FIGS. 13, 13A. In principle, the filter according to FIG. 14 corresponds to FIG. 9, but is designed for asymmetric (i.e., single-ended/single-ended) operation.

Figure 5A:
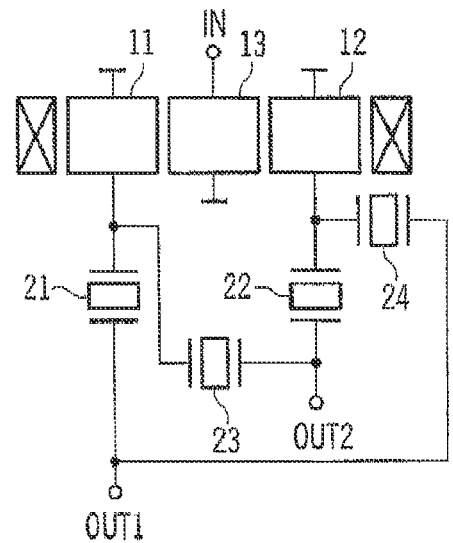
FIG. 5A shows a filter in which the band-stop filter features a bridge circuit of four resonators.

FIG. 5A shows an alternative of the embodiment illustrated in FIG. 5. The ladder type arrangement of acoustic resonators is replaced with a lattice type arrangement of resonators, i.e., a bridge circuit.

The band-pass filter 100 can be arranged between the series element and the parallel element of the band-stop filter 200 as shown in FIGS. 6, 7, 7A, 11, 16, 16A. In this case the shunt arm with the parallel element 23, 24 is connected to the input path and the input transducer 13. In FIGS. 6, 7, 7A, 16, 16A, the series elements 21, 22 are arranged in the series branches of the balanced output path—analogous to FIGS. 3, 4, 5.

A balanced signal path features a first and a second partial path. The signal amplitude in these partial paths is preferably essentially identical in at least one frequency range, wherein the phase difference between the partial paths amounts to 180°.

Figure 11:
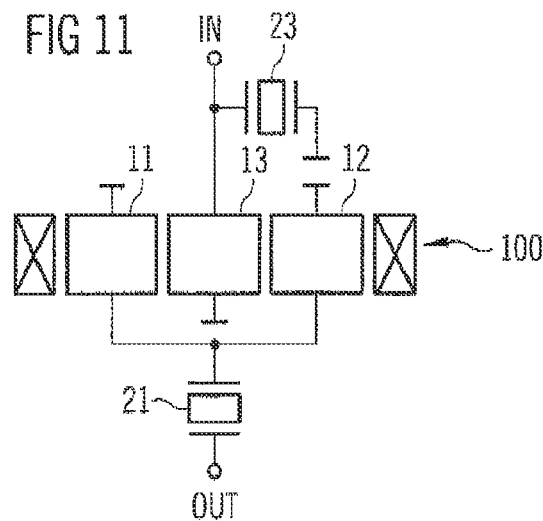
FIG. 11 shows a filter that on both sides is wired unbalanced to ground, wherein the series element of the band-stop filter is arranged in the output path and the parallel element is arranged in the input path.

In FIG. 11, the series element 21 of the band-stop filter is arranged in a single-ended output path, to which both output transducers 11, 12 are connected. In principle, the filter according to FIG. 11 corresponds to the filter according to FIG. 6, but is designed for asymmetric (i.e., single-ended/single-ended) operation.

In the variations according to FIGS. 7, 7A, 8, 8A, 8B, the series elements 21, 22 of the band-stop filter 200 are acoustically coupled to one another, but are arranged in different output paths.

In FIG. 7A, the parallel element 23 is realized in the form of a one-port resonator. The coupled series elements 21, 22 are realized in the form of transducers that are arranged adjacent to one another in an acoustic track. The acoustic track is bounded by acoustic reflectors 33, 34 and realized in the form of a two-port resonator that represents a quadripole.

The shunt arm in the variation according to FIG. 8A was already described in connection with the variation shown in FIG. 3. The filters according to FIGS. 8, 8A respectively represent a variation of the filter shown in FIG. 3, wherein the series elements 21, 22 are, in contrast to FIG. 3, acoustically coupled to one another. This also applies to FIGS. 6 and 7, 7A.

Figure 8:
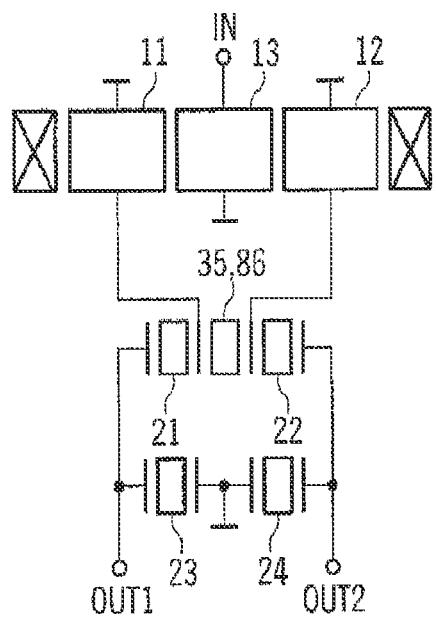
FIG. 8 shows a filter with two series elements that are acoustically coupled to one another and one shunt arm with two series-connected parallel elements.
Figure 8A:
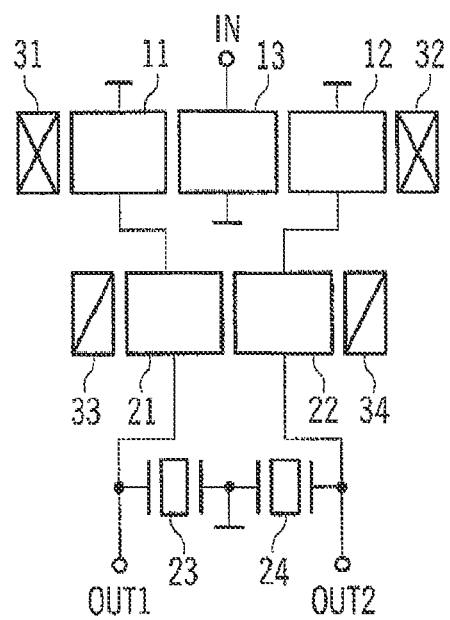
FIG. 8A shows a variation of the filter according to FIG. 8, in which the band-stop filter features a surface acoustic wave multi-port resonator.
Figure 8B:
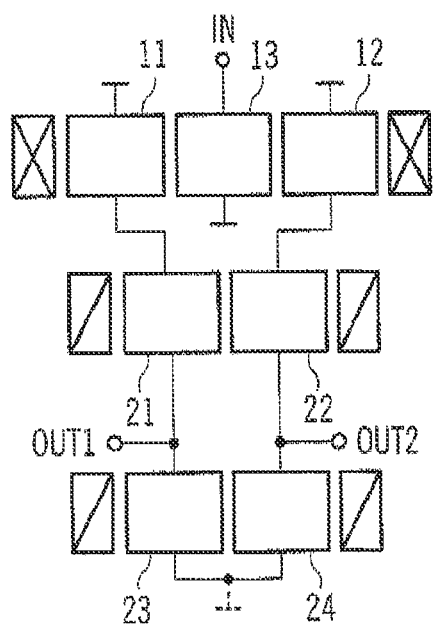
FIG. 8B shows a variation of the filter according to FIG. 8, in which the band-stop filter comprises two acoustic transducers, each with the same transducers acoustically coupled with each other.

In the variation according to FIG. 8B, parallel elements 23, 24 of the band-stop filter 200 are also acoustically coupled to one another. They are realized in a two-port resonator or a one-port resonator with acoustically coupled partial resonators that are connected in series.

Figure 8C:
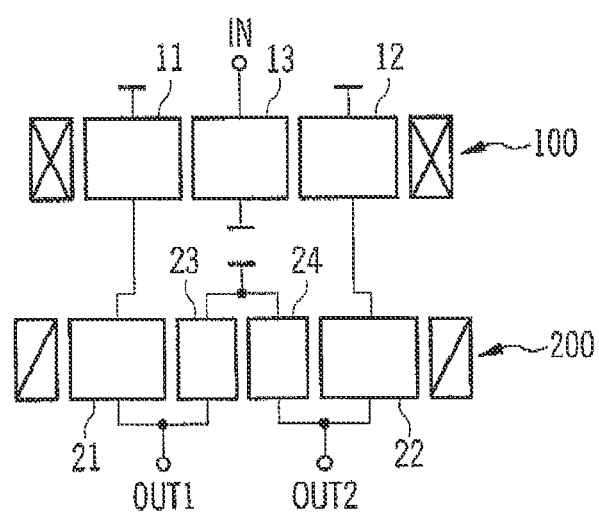
FIG. 8C shows a variation of the filter according to FIG. 8, in which the series elements are acoustically coupled to the parallel element.

FIG. 8C shows another variation of the filter according to FIG. 8, in which the entire band-stop filter is realized within one track. The series elements 21, 22 and the parallel elements 23, 24 arranged in the shunt arm are in this case arranged in a common acoustic track. The series elements 21, 22 and the parallel elements 23, 24 are acoustically coupled to one another.

The parallel elements 23, 24 are arranged adjacent to one another and connected in series. The parallel elements 23, 24 are preferably realized in the form of partial transducers of a transducer and connected to a common busbar on one side. The electric node at which the two parallel elements are electrically connected to one another is grounded in the variation shown. This node or the common busbar can also be realized in a floating fashion. FIGS. 15, 15A, 16, 16A, 17 show different embodiments of the filter in which the parallel elements 23, 24 of the band-stop filter 200 are acoustically coupled to one another.

Figure 10:
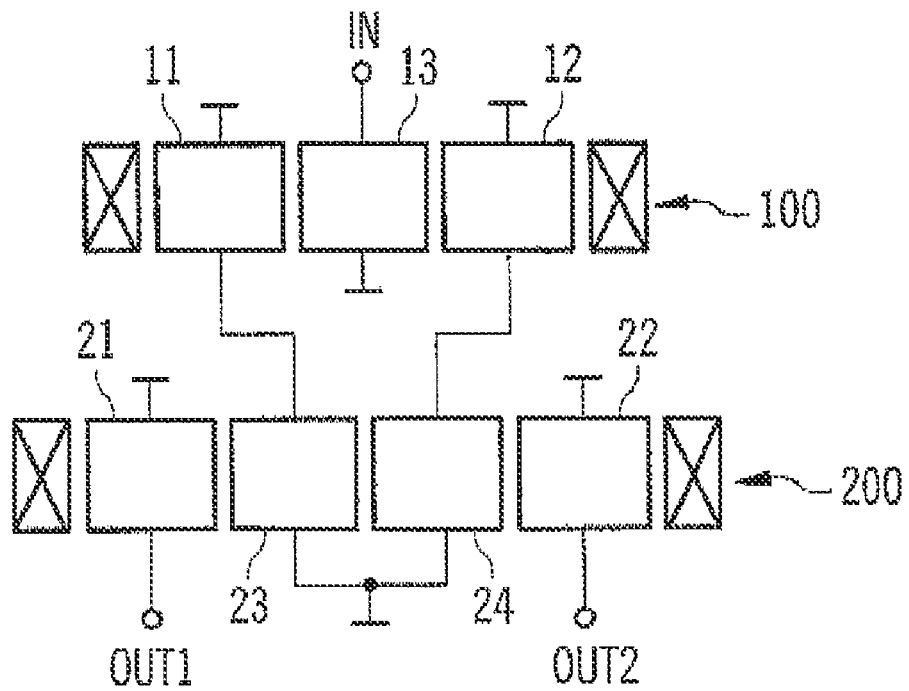
FIG. 10 shows a filter in which the band-stop filter comprises a multi-port resonator with series and parallel elements arranged in an acoustic track.

In the variation according to FIG. 10, the band-stop filter 200 comprises a multi-port resonator that features a transducer arrangement with four adjacently arranged transducers. The end-situated transducers (in this case series transducers) of the two-port resonator are provided as series elements 21, 22 of the band-stop filter 200. The centrally arranged transducers that are connected in series (in this case parallel transducers) are provided as parallel elements 23, 24 of the band-stop filter 200 and conductively connected to the transducers 11, 12 of the DMS filter. The parallel transducers serve as coupling transducers for coupling the output signal of the DMS filter into the acoustic track of the multi-port resonator.

In this case, series elements 21, 22 of the band-stop filter 200, as well as parallel elements 23, 24 thereof, are acoustically coupled to one another.

Figure 12:
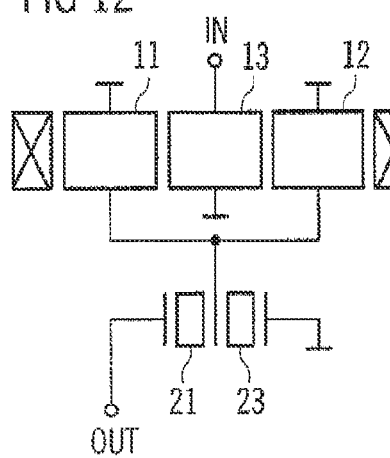
FIG. 12 shows a filter that on both sides is wired unbalanced to ground, wherein the series element and the parallel element of the band-stop filter are acoustically coupled to one another.
Figure 12A:
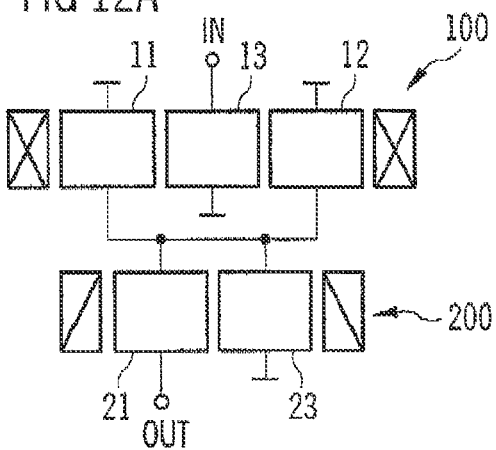
FIG. 12A shows the filter according to FIG. 12, in which the series element and the parallel element of the band-stop filter are arranged in an acoustic track.

FIGS. 8C, 12, 12A, 13, 13A show different embodiments of the filter in which the series element 21 is acoustically coupled to the parallel element 23. In FIGS. 12A and 13A the coupled elements 21, 23 of the band-stop filter 200 are realized in the form of transducers that are arranged adjacent to one another in an acoustic track.

In FIGS. 12, 12A, both band-stop elements 21, 23 are conductively connected to one another and to the transducers 11, 12 of the band-pass filter 100. The shunt arm with the parallel element 23 is arranged between the series element 21 and the band-pass filter 100 in this case.

The band-stop filter 200 is arranged between the input IN and the band-pass filter 100 in FIGS. 13, 13A. The shunt arm with the parallel element 23 is connected to the input IN of the filter. The series element 21 is connected in series to the third transducer 13 of the band-pass filter 100.

In the variations according to FIGS. 15A, 16A, the band-stop filter 200 comprises an inline arrangement according to FIG. 2C.

The inline arrangement according to FIG. 15A comprises parallel elements 23, 24 (transducers 71, 72 in FIG. 2C), terminal reflectors 33, 34 and an intermediate reflector 35 arranged between the transducers. The parallel elements 23, 24 are connected in series and grounded, if applicable.

The filters according to FIGS. 15, 15A respectively represent a variation of the filter according to FIG. 3, wherein the parallel elements 23, 24 are, in contrast to FIG. 3, acoustically coupled to one another.

The band-stop filter shown in FIGS. 16, 16A comprises a parallel element 23 that is arranged on the input side, and series elements 21, 22 that are arranged on the output side and wired as well as acoustically coupled to one another, analogous to the variation shown in FIG. 8.

The inline arrangement according to FIG. 16A comprises series elements 21, 22 (transducers 71, 72 in FIG. 2C), terminal reflectors 33, 34 and an intermediate reflector 36 that is arranged between the transducers. The series elements 21, 22 are arranged in different output paths.

FIG. 17 shows an embodiment in which the band-stop filter 200 comprises two inline arrangements. Analogous to the variation shown in FIG. 16A, the first inline arrangement comprises two transducers (series elements 21, 22) between which an intermediate reflector 36 is arranged that can be in part acoustically permeable, if applicable. The second inline arrangement corresponds to that shown in FIG. 16A.

The intermediate reflectors 35, 36 make it possible to adjust the desired degree of acoustic coupling between the transducers.

It is possible to realize other combinations of the band-pass filter 100 shown in FIGS. 1A-1E and the band-stop filter 200. The reflectors 31, 32, 33, 34, 35, 36 are realized in a floating fashion in the figures. In principle, however, they can also be grounded.

The band-stop filter according to FIG. 5A is realized in the form of a bridge circuit and contains four acoustic resonators that are acoustically decoupled from one another. However, two respective resonators or all four resonators can also be acoustically coupled to one another.

If suitably wired, the bridge circuit can in principle be realized with two two-port resonators that respectively feature two coupled transducers as in FIG. 8B, with two inline arrangements according to FIG. 17 or with an inline arrangement with four transducers in an acoustic track according to FIG. 10.

FIG. 18A shows a transfer function 1 of a filter circuit that features a DMS filter but no band-stop filter. This figure also shows a transfer function 2 of a filter circuit that comprises a DMS filter and a band-stop filter.

FIG. 18B shows the transfer function 2, as well as the admittance curve 2s for the series element and the admittance curve 2p for the parallel element of the band-stop filter. The admittance curves correspond to the magnitude of the conductance Y21 that is plotted as a function of the frequency. The resonance of the series element lies at 2142 MHz, i.e., in the passband of the DMS filter.

The anti-resonance of the series element lies at 2220 MHz, i.e., in the range of the upper flank of the transfer function 2. The resonance of the parallel element lies at 2263 and the anti-resonance of the parallel element lies at 2343 MHz. All these resonance frequencies lie above the passband of the DMS filter. The filter circuit with the band-stop filter has an improved adjacent channel broadband selectivity above the passband of the DMS filter under these circumstances.

In this case, it was possible to increase the adjacent channel selectivity of the filter by approximately 15 dB to 39 dB.

Figure 19B:
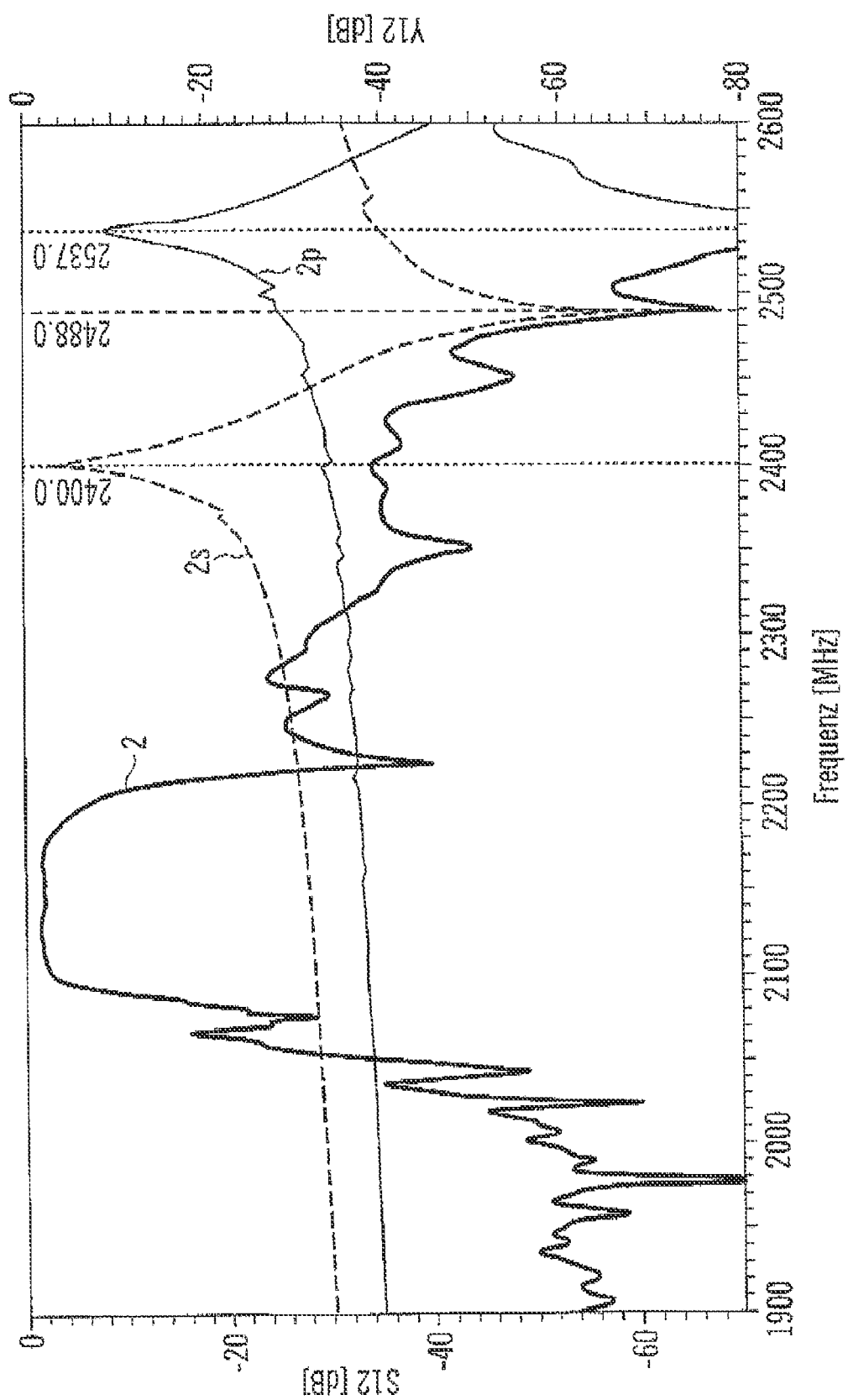

In the variation according to FIGS. 19A, 19B, the resonance of the series element lies at 2400 MHz, the anti-resonance of the series element lies at 2488 MHz, the resonance of the parallel element lies at 2537 MHz and the anti-resonance of the parallel element lies above 2600 MHz. In this case, the resonance frequency of the series element also lies far above the passband of the DMS filter. In this case it is possible to improve the remote selectivity of the filter from 42 dB (without band-stop filter) to 58 dB (with band-stop filter) in the frequency range between 2500 and 2600 MHz.

What is claimed is:

1. An electric filter comprising:
   a band-pass filter that comprises a track with acoustically coupled electroacoustic transducers; and
   a band-stop filter that is electrically connected to the band-pass filter and comprises at least one electroacoustic series element and at least one electroacoustic parallel element,
   wherein the at least one electroacoustic series element is connected in series to at least one of the electroacoustic transducers of the band-pass filter,
   wherein the band-stop filter comprises a shunt arm in which the at least one electroacoustic parallel element is arranged,
   wherein a resonance frequency and an anti-resonance frequency lie outside a passband of the band-pass filter in at least one of the electroacoustic elements of the band-stop filter,
   wherein the filter further comprises a first signal path and a second signal path,
   wherein a series circuit of a first series element of the band-stop filter and a first transducer of the band-pass filter is arranged in the first signal path,
   wherein a series circuit of a second series element of the band-stop filter and a second transducer of the band-pass filter is arranged in the second signal path, and
   wherein the first and the second series elements of the band-stop filter are acoustically coupled.

2. The filter according to claim 1,
   wherein the resonance frequency and the anti-resonance frequency lie outside the passband of the band-pass filter in the at least one electroacoustic series element of the band-stop filter, and
   wherein the resonance frequency and the anti-resonance frequency lie outside the passband of the band-pass filter in the at least one electroacoustic parallel element of the band-stop filter.

3. The filter according to claim 1,
   wherein the resonance frequency and the anti-resonance frequency lie above the passband of the band-pass filter in the at least one electroacoustic series element of the band-stop filter, and
   wherein the resonance frequency and the anti-resonance frequency lie above the passband of the band-pass filter in the at least one electroacoustic parallel element of the band-stop filter.

4. The filter according to claim 1,
   wherein the resonance frequency lies in the passband of the band-pass filter in the at least one electroacoustic series element of the band-stop filter, and
   wherein the resonance frequency and the anti-resonance frequency lie above the passband of the band-pass filter in the at least one electroacoustic parallel element of the band-stop filter.

5. The filter according to claim 1,
   wherein the resonance frequency and the anti-resonance frequency lie below the passband of the band-pass filter in the at least one electroacoustic series element of the band-stop filter, and
   wherein the resonance frequency and the anti-resonance frequency lie below the passband of the band-pass filter in the at least one electroacoustic parallel element of the band-stop filter.

6. The filter according to claim 1,
   wherein the resonance frequency and the anti-resonance frequency lie below the passband of the band-pass filter in the at least one electroacoustic series element of the band-stop filter, and
   wherein the anti-resonance frequency lies in the passband of the band-pass filter in the at least one electroacoustic parallel element of the band-stop filter.

7. The filter according to claim 1,
   wherein the at least one electroacoustic series element comprises at least one SAW transducer, and/or
   wherein the at least one electroacoustic parallel element comprises at least one SAW transducer.

8. The filter according to claim 1,
   wherein the at least one electroacoustic series element comprises at least one BAW resonator, and/or
   wherein the at least one electroacoustic parallel element comprises at least one BAW resonator.

9. The filter according to claim 1, further comprising an acoustic reflector arranged between the first and second series elements of the band-stop filter.

10. The filter according to claim 1, wherein the band-stop filter features an inline arrangement that comprises the first and the second series elements of the band-stop filter.

11. An electric filter comprising:
    a band-pass filter that comprises a track with acoustically coupled electroacoustic transducers;
    a band-stop filter that is electrically connected to the band-pass filter and comprises at least one electroacoustic series element and at least one electroacoustic parallel element, a first signal path; and
a second signal path,
wherein a series circuit of a first series element of the band-stop filter and a first transducer of the band-pass filter is arranged in the first signal path,
wherein a series circuit of a second series element of the band-stop filter and a second transducer of the band-pass filter is arranged in the second signal path,
wherein the band-stop filter comprises a shunt arm in which the at least one electroacoustic parallel element is arranged,
wherein a resonance frequency and an anti-resonance frequency lie outside a passband of the band-pass filter in at least one of the electroacoustic elements of the band-stop filter,
wherein the band-stop filter comprises a first parallel element and a second parallel element, and
wherein a series circuit of the first and the second parallel elements is arranged in the shunt arm.

12. The filter according to claim 11, further comprising an inline arrangement that comprises the first and the second parallel elements of the band-stop filter.

13. The filter according to claim 11, wherein the first and the second parallel elements are acoustically coupled.

14. An electric filter comprising:
a band-pass filter that comprises a track with acoustically coupled electroacoustic transducers;
a band-stop filter that is electrically connected to the band-pass filter and comprises at least one electroacoustic series element and at least one electroacoustic parallel element,
a first signal path; and
a second signal path,
wherein a series circuit of a first series element of the band-stop filter and a first transducer of the band-pass filter is arranged in the first signal path,
wherein a series circuit of a second series element of the band-stop filter and a second transducer of the band-pass filter is arranged in the second signal path,
wherein the band-stop filter comprises a shunt arm in which the at least one electroacoustic parallel element is arranged,
wherein a resonance frequency and an anti-resonance frequency lie outside a passband of the band-pass filter in at least one of the electroacoustic elements of the band-stop filter,
wherein the shunt arm connects the first signal path and the second signal path.

15. An electric filter comprising:
a band-pass filter that comprises a track with acoustically coupled electroacoustic transducers;
a band-stop filter that is electrically connected to the band-pass filter and comprises at least one electroacoustic series element and at least one electroacoustic parallel element,
a first signal path; and
a second signal path,
wherein a series circuit of a first series element of the band-stop filter and a first transducer of the band-pass filter is arranged in the first signal path,
wherein a series circuit of a second series element of the band-stop filter and a second transducer of the band-pass filter is arranged in the second signal path,
wherein the band-stop filter comprises a shunt arm in which the at least one electroacoustic parallel element is arranged,
wherein a resonance frequency and an anti-resonance frequency lie outside a passband of the band-pass filter in at least one of the electroacoustic elements of the band-stop filter,
wherein the filter further comprises a third signal path, in which a third transducer of the band-pass filter is arranged,
wherein the third signal path is electrically isolated from the first and the second signal path,
wherein the shunt arm is connected to the third signal path, and/or
wherein at least one electroacoustic series element of the band-stop filter is arranged in the third signal path.

16. An electric filter comprising:
a band-pass filter that comprises a track with acoustically coupled electroacoustic transducers; and
a band-stop filter that is electrically connected to the band-pass filter and comprises at least one electroacoustic series element and at least one electroacoustic parallel element,
wherein the at least one electroacoustic series element is connected in series to at least one of the electroacoustic transducers of the band-pass filter,
wherein the band-stop filter comprises a shunt arm in which the at least one electroacoustic parallel element is arranged,
wherein a resonance frequency and an anti-resonance frequency lie outside a passband of the band-pass filter in at least one of the electroacoustic elements of the band-stop filter, and
wherein the band-stop filter features an inline arrangement that comprises the at least one electroacoustic series element and the at least one electroacoustic parallel element of the band-stop filter.

17. The filter according to claim 16, wherein the at least one electroacoustic series element and the at least one electroacoustic parallel element of the band-stop filter are acoustically coupled.

* * * * *